United States Patent [19]

Schmitt et al.

[11] Patent Number: 5,391,990
[45] Date of Patent: Feb. 21, 1995

[54] ITERATIVE SHIMMING METHOD FOR A BASIC FIELD MAGNET OF A NUCLEAR MAGNETIC RESONANCE TOMOGRAPHY APPARATUS

[75] Inventors: Franz Schmitt, Erlangen; Hubertus Fischer, Bamberg, both of Germany

[73] Assignee: Siemens Aktiengesellschaft, Munich, Germany

[21] Appl. No.: 105,647

[22] Filed: Aug. 13, 1993

[30] Foreign Application Priority Data

Aug. 17, 1992 [DE] Germany .................. 4227162

[51] Int. Cl.$^6$ ........................................ G01V 3/00
[52] U.S. Cl. ................................ 324/320; 324/319
[58] Field of Search ............. 324/300, 307, 309, 318, 324/319, 320; 128/653.5

[56] References Cited

U.S. PATENT DOCUMENTS

| | | | |
|---|---|---|---|
| 3,569,823 | 10/1968 | Goley | 336/200 |
| 4,748,409 | 5/1988 | Frahm et al. | 324/309 |
| 4,761,614 | 8/1988 | Prammer et al. | 324/320 |
| 4,899,109 | 2/1990 | Tropp et al. | 324/320 |
| 4,987,371 | 1/1991 | Glover et al. | 324/320 |
| 5,006,804 | 4/1991 | Dorri et al. | 324/320 |

OTHER PUBLICATIONS

"Aspects of Shimming a Superconductive Whole-Body MRI-Magnet," Frese et al., Proc. of the 9$^{th}$ Int. Conf. on Magnet Technology, Zurich, Sep. 9–13, 1985, pp. 249–251.

"NMR Imaging Techniques and Applications: A Review," Bottomley, Rev. Sci. Instrum. 53(9), Sep. 1982, pp. 1319–1337.

"Fast, Noniterative Shimming of Spatially Localized Signals. In Vivo Analysis of the Magnetic Field along Axes," Gruetter, J. Mag. Res. vol. 96 (1992), pp. 233–334.

Primary Examiner—Louis Arana
Attorney, Agent, or Firm—Hill, Steadman & Simpson

[57] ABSTRACT

To improve the homogeneity of the basic magnetic field generated in a nuclear magnetic resonance tomography unit, an iterative shimming method includes the steps of generating a pulse sequence in the form of a bipolar gradient pulse train in the examination volume, and entering the echo signals which are acquired into a measured matrix. A correlation coefficient of the echo signals of at least a part of the rows of the measurement matrix is formed with respect to a reference row. The shim current through at least one shim coil in the tomography apparatus is then varied in a manner causing the correlation coefficient to increase. These steps are repeated until the correlation coefficient reaches a selected value which is large enough to indicate that an adequate basic field homogeneity has been achieved.

15 Claims, 6 Drawing Sheets

ITERATIVE SHIMMING METHOD FOR A BASIC FIELD MAGNET OF A NUCLEAR MAGNETIC RESONANCE TOMOGRAPHY APPARATUS

BACKGROUND OF THE INVENTION

1. Field of the Invention

The present invention is directed to an iterative shimming method for generating a homogenized basic field in a nuclear magnetic tomography apparatus.

2. Description of the Prior Art

In a nuclear magnetic resonance tomography apparatus, the homogeneity of the basic magnetic field is a critical factor for the imaging quality. Field inhomogeneities in the image region cause geometrical image distortions in the imaging which are proportional to the field deviations. A high field homogeneity is also required in order to separate the resonant lines of fat and water. This enables a suppression of the nuclear magnetic resonance signals which arise from fat tissue, which are generally not of interest. The field inhomogeneity for this purpose must be less than 3.5 ppm over the examination volume. A further complicating factor is that the inhomogeneity arising from the basic field magnet is additively superimposed with inhomogeneities arising from the examination subject. This leads to susceptibility artifacts. In certain instances, an improvement in the basic field inhomogeneity is necessary in vivo, i.e., when the examination subject, generally a human body, is in the basic field.

As described in the article "Aspects of Shimming a Superconductive Whole Body MRI Magnet," Frese et al, Proceedings of the 9th Int. Conf. on Mag. Techn., Zürich, September, 1985, pages 249-251, a magnetic field can be represented using the coefficients arising in the expansion in spherical harmonics of the equation for the magnetic field. This article also described the compensation of field deviations by electrical shim coils. Linear field deviations, i.e., field errors of the first order, can also be compensated by charging the gradient coils with an offset current, i.e., with a constant current that is superimposed on a gradient pulse sequence.

Given more stringent demands on the field homogeneity, not only linear field deviations but also field errors of a higher order must be compensated. Separate shim coils, which are to be charged with a suitable current, must be provided for this purpose in addition to the gradient coils. During imaging, the shimming, i.e., the setting of the currents via the individual shim coils as well as, if necessary, the use of the offset current in gradient coils, is preferably implemented before the examination of each individual patient, with the patient in the examination volume.

The setting of the currents for the shim coils, and the offset currents for the gradient coils, in order to achieve an optimum field homogeneity represents a complex problem which has usually often resolved by trial and error. When this shimming must be undertaken with the patient in the basic field, in order to compensate for field inhomogeneities arising from the examination subject, the dwell time of the patient in the nuclear magnetic resonance tomography apparatus is lengthened. This is disadvantageous both in view of the physical stress on the patient (particularly patients with a tendency to claustrophobia), as well as in view of the patient throughput.

A non-iterative method for general shimming of magnets is described in the article, "Fast, Non-iterative Shimming of Spatially Localized Signals," in the Journal of Magnetic Resonance, pages 323-334 (1992). In this known method, the phase of nuclear spins in the respective directions of a plurality of projections are identified with stimulated echo sequences. A magnetic field course (path) in these projections can be measured due to the phase course, and given representation of the magnetic field in spherical harmonic functions, the coefficients thereof can be identified. Each shim coil is allocated to a spherical harmonic function of the nth degree and of the mth order. The coefficients identified in this manner are then employed as a criterion for the currents to be supplied to the shim coils.

Non-iterative methods, in general, are faster than iterative (interactive) methods, however, it has been shown in practice that due to the complex physical relationships, non-iterative methods do not always lead to satisfactory results.

SUMMARY OF THE INVENTION

It is an object of the present invention to provide an iterative shimming method for use in a nuclear magnetic resonance tomography apparatus which permits an adequate basic field homogeneity to be achieved in a rapid manner.

The above object is achieved in accordance with the principles of the present invention in an iterative shimming method for homogenizing the field of a basic field magnet in a nuclear magnetic resonance tomography apparatus having shim coils through which an adjustable shim current flows, and having gradient coils, including the steps of exciting a spin system in the examination space of the apparatus using a radio frequency excitation pulse, sampling the resulting echo signals and entering the sampled signals, per echo signal, into a row of a measured data matrix, forming correlation coefficients of the echo signals of at least a pan of the rows of the matrix with respect to a reference row, varying the shim current in at least one shim coil in a manner so as to increase the correlation coefficients. The above steps are then repeated using the shim current which has been varied in this manner and, if necessary, the shim current is again varied and the steps again repeated. This sequence is repeated until a basic field homogeneity which is acceptable for the current examination is present in the examination space.

In the above-identified first embodiment of the invention, not only linear field deviations but also field errors of a higher order can be compensated. In a second embodiment of the invention, only linear field deviations can be compensated. In this second embodiment, a spin system is excited in the examination space with a radio frequency pulse, a plurality of echo signals are generated by a bipolar gradient pulse sequence in a first direction, with each echo signal being sampled and entered into a row of a measured data matrix. The position of an echo maximum in each row of the measured data matrix is identified. A shift of the echo maxima from row to row is identified from a linear fit of the echo maxima over the rows, and the current through a shim coil is set on the basis of this shift such that the first, linear term of the expansion coefficient is reduced. The above steps are then implemented in succession until the first linear term is sufficiently small.

It is also possible to combine the above embodiments by compensating for linear field deviations by implementing the second embodiment, followed by compensation of field errors or a higher order using the first embodiment.

DESCRIPTION OF THE PREFERRED EMBODIMENTS

As is known, a topical resolution of nuclear magnetic resonance signals in a nuclear magnetic resonance tomography apparatus ensues by generating a uniform, static basic magnetic field, on the order of one tesla, and superimposing a linear magnetic field gradient on the basic magnetic field. The principles of such imaging are explained, for example, in the article by Bottomley entitled "NMR-imaging Techniques and Application: A Review," in Review of Scientific Instrumentation, 53 (9), 9/82, pages 1319–1337.

Figure 1:
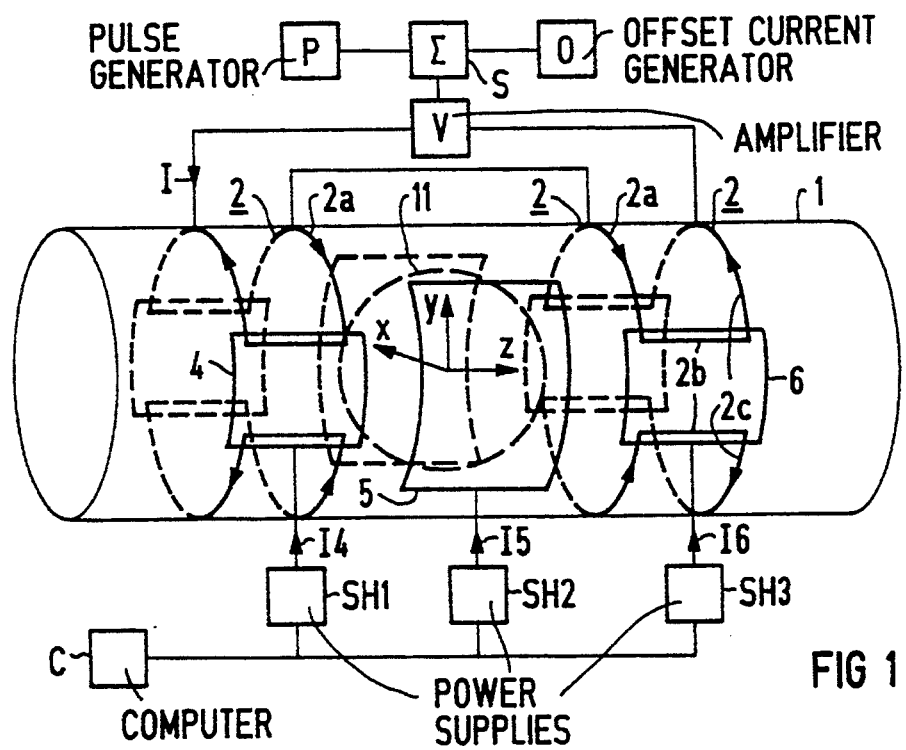
FIG. 1 is a schematic representation of the examination volume in a nuclear magnetic resonance tomography apparatus, showing the y-gradient coil, shim coils, and relevant operating components, operable in accordance with the method of the invention.
Figure 2:
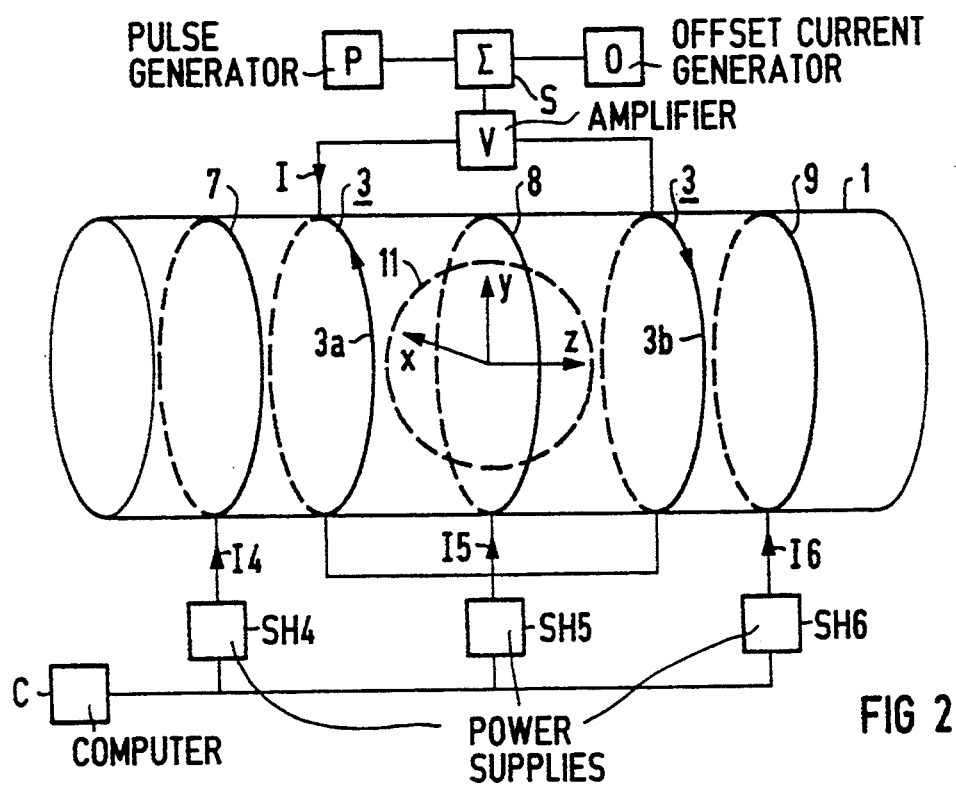
FIG. 2 is a schematic representation of a z-gradient coil for use in combination with the apparatus shown in FIG. 1, and also showing further shim coils.

For topical resolution in three dimensions, magnetic field gradients must be generated in three directions, and are preferably disposed perpendicularly relative to each other. A Cartesian coordinate system indicating the x, y, z directions, which illustrate the direction of the respective gradients, is shown in FIGS. 1 and 2. FIG. 1 schematically shows a conventional arrangement of gradient coils for generating a magnetic field gradient Gy in y-direction. The gradient coils 2 for generating the gradient Gy are in the form of saddle coils, and are secured on a carrying tube 1. A substantially constant magnetic field gradient Gy in y-direction is generated within a spherical examination volume 11 due to the conductor sections 2a. The return conductors 2c, connected to conductor sections 2a via conductor sections 2b, generate only negligble components in the examination volume 11, due to their much greater distance from the examination volume 11.

The gradient coils for generating the magnetic field gradient in the x-direction are identical to the gradient coils 2 for generating the gradient field in the y-direction, but are rotated on the carrying tube 1 by 90° in the azimuthal direction relative to the gradient coils 2. For clarity, the coils for generating the gradient in x-direction are therefore not shown in FIG. 1.

FIG. 1 also shows shim coils 4, 5 and 6, which are also in the form of saddle coils. The shim coils 4, 5 and 6 are only schematically indicated. Further details regarding the design of such shim coils may be found, for example, in U.S. Pat. No. 3,569,823. Each shim coil 4, 5 and 6 has a power supply SH1, SH2 or SH3 respectively allocated thereto. These power supplies supply the shim coils 4, 5 and 6 with respective currents I4, I5 and I6. The currents I4, I5 and I6 are controllable by means of a computer C.

The gradient coils for generating the magnetic field gradient in the z-direction are schematically shown in FIG. 2. These coils are annularly executed, and are arranged symmetrically relative to the midpoint of the examination volume 11. The gradient coils for generating the gradient in the z-direction include individual coils 3a and 3b, which have respective currents flowing therein in opposite directions, as indicated by the arrows in FIG. 2, so as to generate the magnetic field gradient in the z-direction. Further shim coils 7, 8 and 9 also shown only schematically, can be seen in FIG. 2, which are also annular coils. The shim coils 7, 8 and 9 are charged with respective currents I7, I8 and I9 by respective power supplies SH4, SH5 and SH6. The currents I7, I8 and I9 are also controllable by the computer C.

FIGS. 1 and 2 also show the power supply V for the gradient coils 2 and 3. The respective currents I2 and I3 flowing through the gradient coils 2 and 3 are defined by a pulse generator P, which generates a pulse sequence, and by a generator O which generates a constant offset current. The output signals of the pulse generator P and of the generator O are added in a summing unit S, and are amplified in an amplifier V.

As explained in the aforementioned article by Frese et al, entitled "Aspects of Shimming a Superconductive Whole Body MRi Magnet", magnetic fields can be represented on the basis of spherical harmonic functions obtained in the expansion of the equation for the magnetic field. Accordingly, the axial component Bz of the magnetic field, which is the only component of interest herein, is representable as follows:

$$\vec{B}z(r) = \sum_{n=0}^{\infty} (r/R)^n \sum_{m=0}^{n} P(n,m)(\cos\theta)A(n,m)\cos(m\phi) + \quad (1)$$

$$B(n,m)\sin(m\phi)$$

In the above equation, r, $\theta$ and $\phi$ are the spherical coordinates for the vector r, R is the radius of the imaging volume, P(n,m) represents the corresponding Legendre polynomials of the degree n and the order m, and A(n,m) and B(n,m) are the coefficients of the spherical harmonic functions. The coefficient A(O,O) characterizes the homogenous basic magnetic field; all other coefficients describe homogeneity deviations. As explained in U.S. Pat. No. 3,569,823, identified above, shim coils can be fashioned so that they essentially influence only one of these coefficients, i.e., they compensate for the field disturbance corresponding to this coefficient.

In practice, of course, only a limited number of shim coils can be provided, so that only a corresponding number of the coefficients of the spherical harmonic functions can be set to zero (compensated). The number of shim coils which is required is dependent on the degree of homogeneity of the basic magnetic field which is required for a given examination. Linear field inhomogeneities in the three spatial directions can also be compensated by supplying chronologically constant offset currents to the three gradient coils for the x, y and z directions, in addition to the chronologically variable gradient pulses. If, however, the gradient coils are operated in resonance, which is frequently the case, for example, in the echo planar imaging (EPI) method, the gradient coils cannot be charged with a constant current. In this case, additional shim coils must be provided for the x, y and z-directions, which are constructed similarly to the x, y and z gradient coils.

Figure 3:
FIGS. 3–6 illustrate a typical EPI (echo planar imaging) sequence which can be used in the method of the invention.
Figure 4:
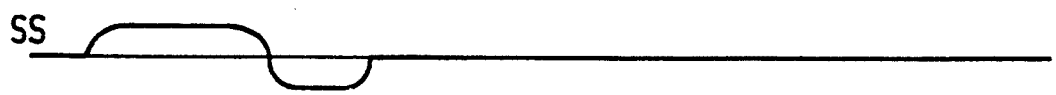

For shimming, it is first necessary to identify the existing magnetic field course. This can be achieved, for example, with a pulse sequence as shown in FIGS. 3–6. A spin system in the examination volume 11 of the nuclear magnetic resonance tomography apparatus is first excited with a 90° radio frequency pulse RF, as shown in FIG. 3. A slice selection gradient SS as shown in FIG. 4 is simultaneously activated during the radio frequency pulse RF, so that only one slice, dependent on the frequency bandwidth of the radio frequency pulse RF, of an examination subject in the examination volume is excited. Subsequently, the dephasing caused by the positive portion of the slice selection gradient SS is cancelled by a negative portion of the slice selection gradient SS. Finally, a bipolar read-out gradient is generated, as indicated by read-out gradient RO shown in FIG. 5, which changes direction repeatedly. Due to the change in the polarity of the read-out gradient RO, the spin system is multiply dephased and subsequently rephased, so that the sequence of echo signals S arises, as shown in FIG. 6.

In the imaging, a gradient in the phase-coding direction is always additionally activated for a topical resolution in the three dimensions, however, this gradient has been omitted in the drawings.

In the pulse sequence shown in FIGS. 3–6, the amplitude S decays in accordance with the FID (free induction decay) signal according to an exponential function as follows:

$$S(t) = S_o \cdot e^{-t/T2^*} \quad (2)$$

$$\frac{1}{T_2^*} = \frac{1}{T_2} + \Delta B_o \cdot t \quad (3)$$

In the above equations, S(t) is the signal amplitude (envelope of the signal), $S_o$ is the signal amplitude immediately after the RF excitation, $T_2$ is the spin-spin relaxation time, $T_2^*$ is the decay time constant of the nuclear magnetic resonance signal including the effects of basic magnetic field inhomogeneities and $T_2$ relaxation, and $\Delta B_0$ is the basic magnetic field inhomogeneity.

As can be seen from equation (2), the basic field inhomogeneity $\Delta B_0$ has a greater influence on the signal amplitude S(t) as the chronological spacing t from the radio frequency pulse becomes larger. When the nuclear spins according to the pulse sequence of FIGS. 3–6 are always alternatingly dephased and rephased with the bipolar gradient pulse RO of FIG. 5, the nuclear magnetic resonance signals which are read out should then all be the same, without a basic field inhomogeneity (i.e., $\Delta B_0 = 0$), apart from the amplitude decay with the $T_2$ constant. The nuclear magnetic resonance signals which are read out under the negative gradient pulses merely exhibit a time inversion.

As is standard in nuclear magnetic resonance tomography technology, each echo is sampled and the digitized samples, per echo, are entered into a row of a measured data matrix. In order to take the different polarity of the gradient pulses into account, the measured values read out under the positive gradient pulses are classified in the measured data matrix from left to right, but the measured values read out under the negative gradient pulses are classified in the measured matrix from right to left. A measured data matrix having a number of rows which corresponds to the number of echoes which have been read out is thereby obtained.

Figure 7:
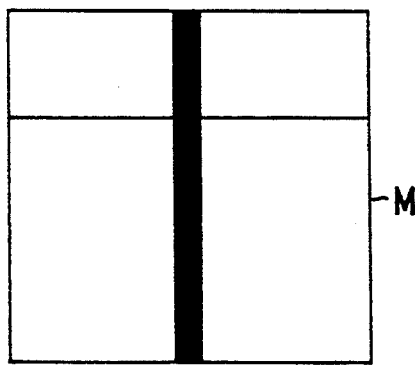
FIG. 7 illustrates the positions of the echo maxima in the measurement data matrix obtained in accordance with the principles of the present invention in the absence of an inhomogeneity in the basic magnetic field.
Figure 8:
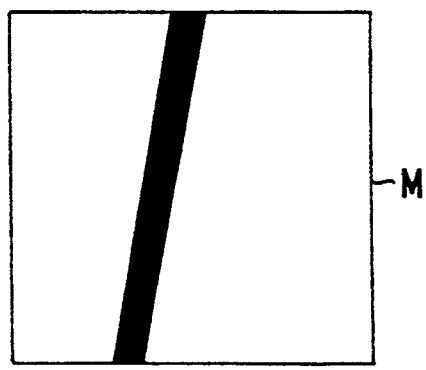
FIG. 8 illustrates the influence of a linear inhomogeneity in the basic magnetic field on the position of the echo maxima in a measurement data matrix obtained in accordance with the principles of the present invention.

Without inhomogeneity of the basic magnetic field, the measured echoes in the measured data matrix M will all be aligned, i.e., they will lie under one another, as schematically shown in FIG. 7 by the thick bar. If, by contrast, a linear inhomogeneity in the basic magnetic field is present in the direction of the read-out gradient RO, the echo maxima will no longer reside vertically above one another, but will be obliquely offset relative to one another along a straight line, as shown in FIG. 8. Dependent on the polarity of the linear field rise or decay, echo maxima which would otherwise lie under one another are offset toward the left or toward the right.

The conditions are somewhat more difficult given inhomogeneities of a higher order in the basic magnetic field. A term known as the $Z^2$ term, which corresponds to the coefficient A(2,0) in the above field equation (1) is generally responsible for the greatest part of the magnetic field inhomogeneities, following the linear terms, and is therefore separately considered as follows.

The echo signal $S_i(t)$ in the echo sequence of FIG. 6 can be represented by the following equation:

$$S_i(t) = \int \rho(x,y,z) \cdot e^{i\gamma \int_o^t G(t')dt' x} \cdot e^{i\gamma \cdot \Delta B_0(x,y,z)} dxdydz \quad (4)$$

Figure 5:
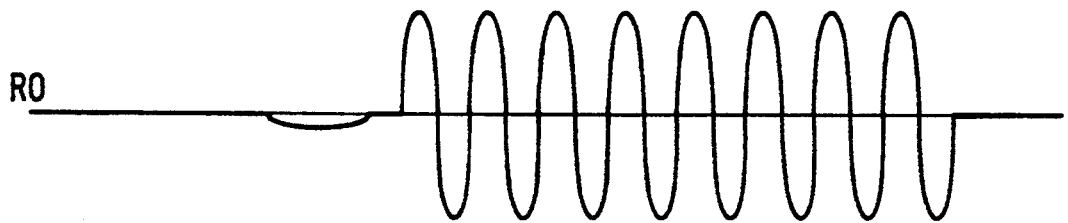
Figure 6:
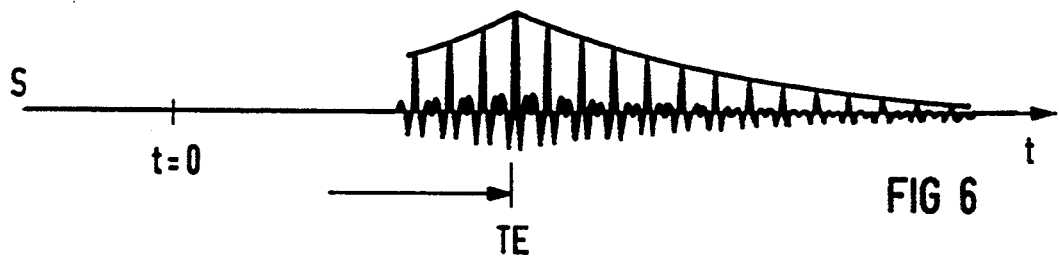

In equation (4), $\rho(x,y,z)$ is the nuclear spin density, $\gamma$ is the gyromagnetic ratio, G(t) is the read-out gradient, (i.e., the gradient RO, for example, as shown in FIG. 5), and $\Delta B_0(x,y,z)$ is the magnetic field inhomogeneity.

As is standard in nuclear magnetic resonance tomography, auxiliary quantities K(t) are defined in the following way:

$$k_i(t) = \gamma \int_{t_i}^t G_x(t')dt', \, k_o = \gamma \int_{t_o}^{t_i} G_x(t')dt' \quad (5)$$

In equation (5), i is the number of the echo signal, which agrees with the row number of the measured data matrix M into which this echo signal is entered.

Applying the definitions of equation (5) in equation (4) results in the following expression for $S_i(t)$:

$$S_i(k) = \int \rho(x,y,z)e^{i(k_i \cdot x + k_o \cdot x)} \cdot e^{i\gamma \Delta B_0 \cdot t} dxdydz \quad (6)$$

Under the assumption that the read-out gradient RO is in the x-direction, the following expression is obtained:

$$s_i(k) = FOU_x[\rho(x,y,z)] * FOU_x[e^{i\gamma \Delta B_0 \cdot t}] \quad (7)$$

Figure 9:
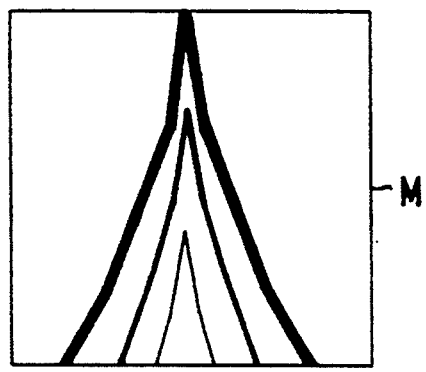
FIG. 9 illustrates the influence of an inhomogeneity of a higher order of the basic magnetic field on the position of the echo maxima in the measurement data matrix obtained in accordance with the principles of the present invention.
Figure 10:
FIGS. 10–13 illustrate a spin echo sequence having a bipolar read-out gradient useable in the inventive method.
Figure 11:
Figure 12:
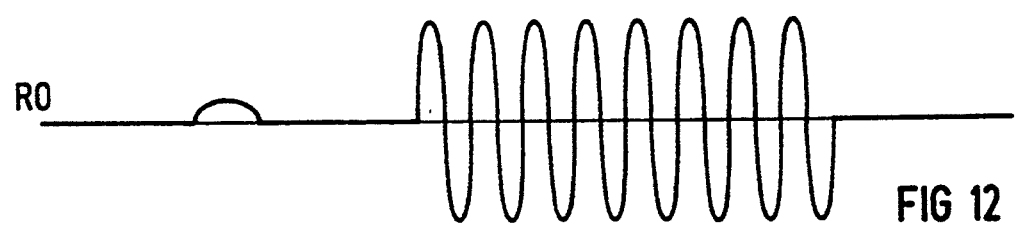
Figure 13:
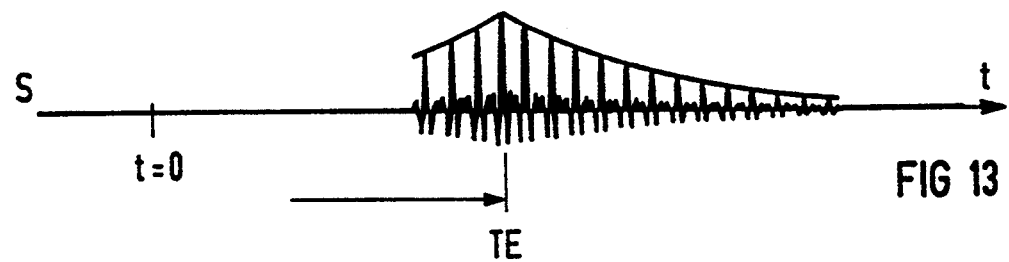
Figure 14:
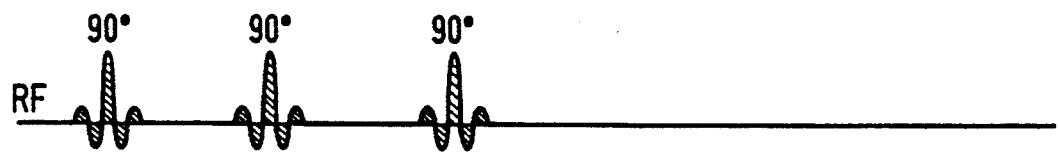
FIGS. 14–17 illustrate a so-called STEAM sequence useable in accordance with the inventive method.
Figure 15:
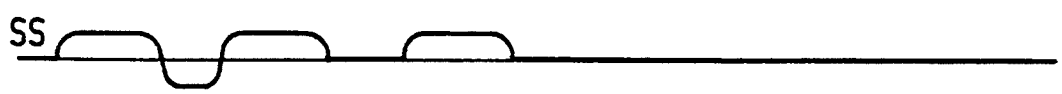
Figure 16:
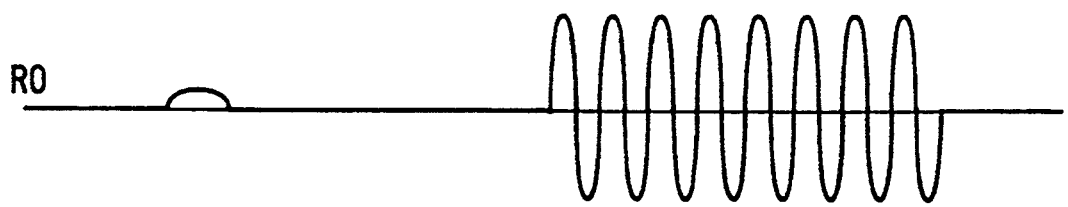
Figure 17:
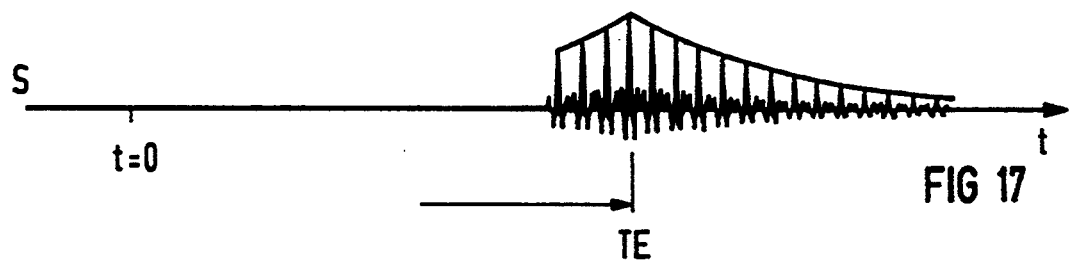

For the general case of a basic field inhomogeneity, this is expressed in a "smearing" of the echoes, as shown in FIG. 9.

If only a linear basic field inhomogeneity $G_x^{off}$ is assumed, i.e., $$\Delta B_o = G_x^{off} \cdot x \tag{8}$$

then equation (7) becomes:

$$S_i(k) = FOU_x[\rho(x,y,z)] * \delta(k - k_{off})$$

$$S_i = S(k) * \delta(k - k_{off})$$

As already set forth above, this represents only a shift of the echo maxima from row to row of the measured data matrix.

Building on the above-recited pulse sequence and the relationships which have been presented between the magnetic field inhomogeneity and the echo distribution in the measured data matrix, the shimming method of the invention can be implemented as follows.

Preferably, linear inhomogeneities in the basic magnetic field in the three spatial directions x, y and z are first compensated. To that end, the pulse sequence as shown in FIGS. 3-6 is first implemented with a read-out gradient RO in, for example, the x-direction and the measured values which are thereby obtained are entered into the measured data matrix M. The echo maximum in each row is identified, and the shift of the echo maxima from row-to-row is identified. Dependent on the shift of the echo maxima, the shim current for the x-direction is increased or reduced. As described above, this shim current can either be supplied as an offset current to the coil (coils) for generating the magnetic gradient in the x-direction, or can be supplied to a separate shim coil for the x-direction. Subsequently, the procedure is repeated with this newly-found shim current, until an adequate shimming in x-direction is achieved. The same procedure is then implemented for the y-direction and for the z-direction.

Figure 18:
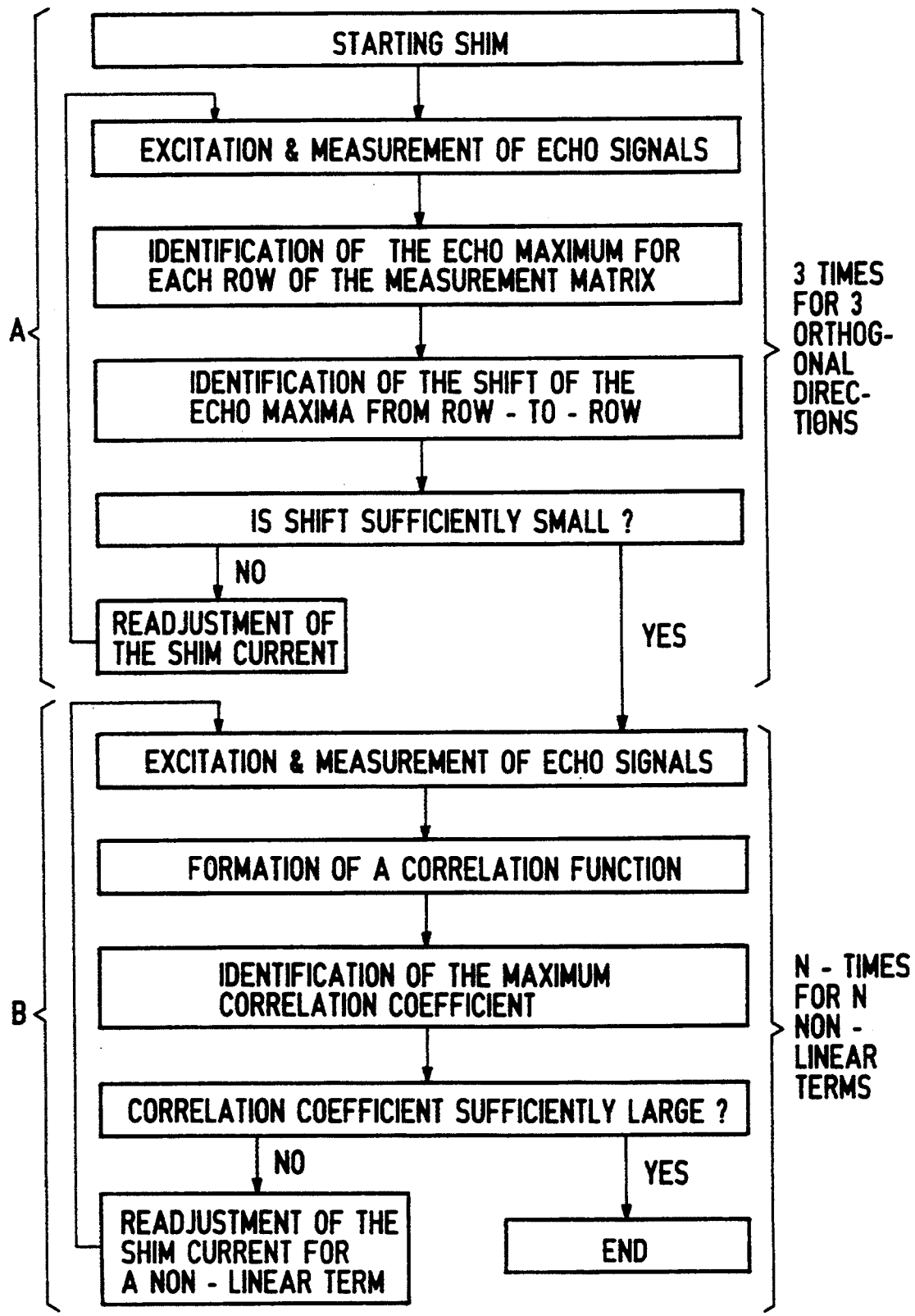
FIG. 18 is an exemplary flow chart for the method of the invention.

AI flow chart for this iterative method is shown in FIG. 18, wherein the steps required for shimming linear magnetic field inhomogeneities are grouped with the designation A.

After shimming linear magnetic field inhomogeneities, terms of a higher order can then be compensated. The pulse sequence shown in FIGS. 3-6 can also be employed for this purpose. The first echo signal from the acquired measured data matrix M, which is in the first row of the measured data matrix M, is selected as a reference signal $S_R(t)$. Subsequently, a correlation function $S_i^c(t)$ is formed for all rows of the measured matrix M as follows:

$$S_i^c(t) = S_i(t) * S_R(t)$$

Lastly, the maximum correlation coefficient is formed, for example with respect to the sum of the correlation functions of all rows. A shim current corresponding to a specific term of the field function according to field equation (1) is then varied such that the sum of the correlation coefficients increases. In general, the $Z^2$ term to which a specific shim coil is allocated will be varied, since this normally corresponds to the largest higher-order field inhomogeneities.

The described method steps are then implemented with the new shim current acquired in this manner for the $Z^2$ shim coil until a sufficient correlation between the reference row and the further rows of the measured data matrix M is obtained, and thus an adequate magnetic field homogeneity with respect to the $Z^2$ term has been achieved.

The iterative method for shimming higher order (non-linear) terms is also shown in the flow chart of FIG. 18, wherein the method steps for the higher terms are grouped and referenced B.

The described method can be implemented not only under the FID envelope, as in the pulse sequence according to FIGS. 3-6, but also under the envelope of a spin echo. A corresponding pulse sequence is shown in FIGS. 10-13. The 90° radio frequency excitation pulse RF1 is followed by a 180° pulse which, due to the effect of a slice selection gradient SS2, is made slice-selective. A spin echo is generated by the 180° radio frequency pulse RF2, i.e., the echo signals do not reach their respective maxima at the beginning of the read-out phase, but only at the echo time TE. This echo signal of maximum amplitude is entered in the middle of the measured data matrix M, and is utilized as the reference signal for the above-described correlation.

Further, the described method can be implemented under the envelope of a stimulated echo. The corresponding pulse sequence for this version is shown in FIGS. 14-17. Generating stimulated echoes for imaging is described in detail, for example, in U.S. Pat. No. 4,748,409. Under the influence of a slice selection gradient SS, a 90° radio frequency pulse RF1 is first generated. A first gradient pulse ROV in the read-out direction follows for pre-phasing the nuclear spins. Two further 90° radio frequency pulses RF2 and RF3 subsequently follow, which are also generated under a slice selection gradient SS in the exemplary embodiment, and are thus made slice-selective. A stimulated echo is generated due to the second radio frequency pulse RF3. Due to the multiple inversion of the read-out gradient RO in a read-out phase, the spin system is multiply dephased and rephased, as in the aforementioned examples, so that the sequence of echo signals S shown in FIG. 17 arises. As in the read-out which takes place under the envelope of a spin echo as described above, the echo signals in this version also do not reach their maxima at the beginning of the read-out phase, but only at the echo time TE. This echo signal of maximum amplitude again is entered in the middle of the measured data matrix, and is used as the reference signal in the above-described correlation.

Due to the slice-selective excitation, which is established in each of the pulse sequences of FIGS. 3-6, FIGS. 10-13 and FIGS. 14-17, the homogeneity can be selectively improved in individual slices of the examination subject. As is known, the width of the selected slice is dependent on the bandwidth of the radio frequency pulse RF which is generated, so that thicker slices or volumes can also be excited by an appropriate selection of the bandwidth.

The above-described method has the advantage that it rapidly converges, so that the basic field homogeneity of the magnet can be significantly improved, even after a short measuring time. No additional hardware outlay is required.

Although modifications and changes may be suggested by those skilled in the art, it is the intention of the inventors to embody within the patent warranted hereon all changes and modifications as reasonably and properly come within the scope of their contribution to the art.

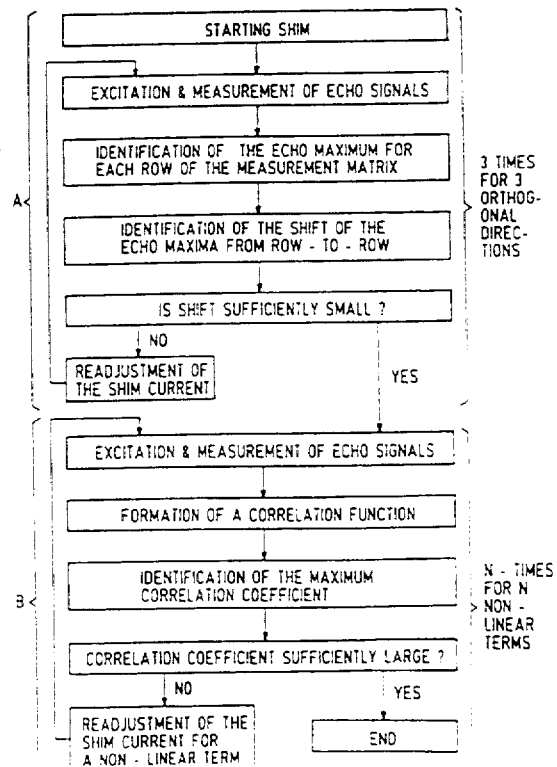

We claim as our invention:

1. An iterative method for shimming a basic field magnet in a nuclear magnetic resonance tomography apparatus having at least one shim coil with an adjustable shim current flowing therein and at least one gradient coil, said method consisting of the steps of:
   (a) exciting a spins system in the examination space of a nuclear magnetic resonance tomography apparatus with a radio frequency excitation pulse;
   (b) generating a plurality of echo signals with a bipolar gradient pulse sequence arising from excitation of said spin system by said radio frequency excitation pulse, and sampling each echo signal to obtain digitized samples for each echo signal and entering said digitized samples per echo signal into respective row of a measured data matrix;
   (c) identifying a reference row of said measured data matrix and forming correlation coefficients of the digitized samples of at least a portion of the rows of said measurement matrix with respect to said reference row;
   (d) varying said shim current in said at least one shim coil to cause an increase in said correlation coefficients;
   (e) repeating step (a) with the varied shim current flowing in said at least one shim coil and repeating steps (b) through (d) to again vary said shim current; and
   (f) repeating steps (a) through (e) until a selected basic field homogeneity has been achieved in said examination space.

2. A method as claimed in claim 1 wherein step (d) is further defined by adding said correlation coefficients to obtain a sum, and varying said shim current in said at least one shim coil to cause an increase in said sum.

3. A method as claimed in claim 1 wherein steps (a) and (b) are further defined by generating said plurality of echo signals by activating said bipolar pulse sequence immediately following said radio frequency excitation pulse with no intervening radio frequency pulses to obtain a first echo signal, and using the digitized samples of said first echo signal in said measured data matrix as said reference row.

4. A method as claimed in claim 1 consisting of the steps of generating a 180° radio frequency pulse between said radio frequency excitation pulse and said bipolar gradient pulse sequence, and employing a row of said measured data matrix which includes an echo maximum as said reference row.

5. A method as claimed in claim 1 consisting of the steps of generating two radio frequency pulses having a flip angle unequal to $M\pi$, M being an integer, between said radio frequency excitation pulse and said bipolar gradient pulse sequence, reading said echo signals out under the envelope of a stimulated echo, and employing a row of said measured data matrix containing an echo maximum as said reference row.

6. A method as claimed in claim 1 wherein the step of generating said radio frequency excitation pulse is further defined by generating a slice-selective radio frequency excitation pulse.

7. A method as claimed in claim 1 wherein the step of generating said radio frequency excitation pulse is further defined by generating a volume-selective radio frequency excitation pulse.

8. An iterative method for shimming a basic field magnet of a nuclear magnetic resonance tomography apparatus having at least one gradient coil and at least one shim coil in which an adjustable shim current flows which influences a first linear term of the expansion coefficients of the field distribution of the magnetic field generated by said basic field magnet in a first direction, said method consisting of the steps of:
   (a) exciting a spins system in the examination space of a nuclear magnetic resonance tomography apparatus with a radio frequency excitation pulse;
   (b) generating a plurality of echo signals with a bipolar gradient pulse sequence arising from excitation of said spin system by said radio frequency excitation pulse, and sampling each echo signal to obtain digitized samples for each echo signal and entering said digitized samples per echo signal into respective row of a measured data matrix;
   (c) identifying the position of an echo maximum in each row of said measured data matrix;
   (d) identifying a shift of said echo maxima from row-to-row from a linear fit method of said echo maxima over said rows;
   (e) adjusting said current flowing through said at least one shim coil dependent on said shift to cause a reduction in a first linear term of said expansion coefficient; and
   (f) repeating steps (a) through (e) successively until said first linear term is selectively small.

9. A method as claimed in claim 8 wherein steps (a) and (b) are further defined by generating said bipolar gradient pulse sequence immediately following said radio frequency excitation pulse with no further radio frequency pulses therebetween.

10. A method as claimed in claim 8 consisting of the steps of generating two radio frequency pulses having a flip angle unequal to $M\pi$, M being an integer, between said radio frequency excitation pulse and said bipolar gradient pulse sequence, and reading out said echo signals under the envelope of a stimulated echo.

11. A method as claimed in claim 8 wherein said nuclear magnetic resonance tomography apparatus includes a plurality of said shim coils, each shim coil influencing respective linear terms of said expansion coefficient of said magnetic field distribution in orthogonal directions, and repeating steps (a) through (f) for each orthogonal direction.

12. A method as claimed in claim 8 wherein the step of generating said radio frequency excitation pulse is further defined by generating a slice-selective radio frequency excitation pulse.

13. A method as claimed in claim 8 wherein the step of generating said radio frequency excitation pulse is further defined by generating a volume-selective radio frequency excitation pulse.

14. An iterative method for shimming a basic field magnet of a nuclear magnetic resonance tomography apparatus having at least one gradient coil and at least one shim coil in which an adjustable shim current flows which influences a first linear term and higher order terms of the expansion coefficients of the field distribution of the magnetic field generated by said basic field magnet in a first direction, said method comprising the steps of:
   (a) exciting a spins system in the examination space of a nuclear magnetic resonance tomography apparatus with a radio frequency excitation pulse;

(b) generating a plurality of echo signals with a bipolar gradient pulse sequence arising from excitation of said spin system by said radio frequency excitation pulse, and sampling each echo signal to obtain digitized samples for each echo signal and entering said digitized samples per echo signal into respective row of a measured data matrix;

(c) identifying the position of an echo maxi,mum in each row of said measured data matrix;

(d) identifying a shift of said echo maxima from row-to-row from a linear fit method of said echo maxima over said rows;

(e) adjusting said current flowing through said at least one shim coil dependent on said shift to cause a reduction in a first linear term of said expansion coefficient; and (f) repeating steps (a) through (e) successively until said first linear term is selectively small.

(g) exciting said spins system in said examination space of said nuclear magnetic resonance tomography apparatus with a further radio frequency excitation pulse;

(h) generating a plurality of further echo signals with further bipolar gradient pulse sequence arising from excitation of said spin system by said radio frequency excitation pulse, and sampling each further echo signal to obtain digitized samples for each echo signal and entering said digitized samples per further echo signal into respective row of said measured data matrix;

(i) identifying a reference row of said measured data matrix and forming correlation coefficients of the digitized samples of at least a portion of the rows of said measurement matrix with respect to said reference row;

(j) varying said shim current in said at least one shim coil to cause an increase in said correlation coefficients;

(k) repeating step (g) with the varied shim current flowing in said at least one shim coil and repeating steps (h) through (k) to again vary said shim current; and (l) repeating steps (g) through (k) until a selected basic field homogeneity compensating said higher order terms has been achieved in said examination space.

15. An iterative method for shimming a basic magnetic field of a nuclear magnetic resonance tomography apparatus having at least one gradient coil supplied with an offset current, said method consisting of the steps of:

(a) exciting a spin system in an examination space of said nuclear magnetic resonance tomography apparatus with a radio frequency excitation pulse;

(b) generating a plurality of echo signals by supplying said gradient coil with a bipolar gradient pulse sequence in a first direction, and sampling each echo signal to obtain digitized samples and entering said digitized samples per echo signal into respective rows of a measured data matrix;

(c) identifying a position of an echo maximum in each row of said measured data matrix;

(d) identifying a shift of said echo maxima from row-to-row from a linear fit method of said echo maxima over said rows and setting said offset current through said gradient coil to cause a reduction in a first linear term of said expansion coefficient; and (e) repeating steps (a) through (d) successively until said first linear term is selectively small.

* * * * *

UNITED STATES PATENT AND TRADEMARK OFFICE
CERTIFICATE OF CORRECTION

PATENT NO. : 5,391,990
DATED : February 21, 1995
INVENTOR(S) : Franz Schmitt, et al.

It is certified that error appears in the above-indentified patent and that said Letters Patent is hereby corrected as shown below:

The title page, should be deleted to appear as per attached title page.

Signed and Sealed this

Tenth Day of October, 1995

*Attest:*

BRUCE LEHMAN

*Attesting Officer*  *Commissioner of Patents and Trademarks*

United States Patent [19]

Schmitt et al.

[11] Patent Number: 5,391,990
[45] Date of Patent: Feb. 21, 1995

[54] ITERATIVE SHIMMING METHOD FOR A BASIC FIELD MAGNET OF A NUCLEAR MAGNETIC RESONANCE TOMOGRAPHY APPARATUS

[75] Inventors: Franz Schmitt, Erlangen; Hubertus Fischer, Bamberg, both of Germany

[73] Assignee: Siemens Aktiengesellschaft, Munich, Germany

[21] Appl. No.: 105,647

[22] Filed: Aug. 13, 1993

[30] Foreign Application Priority Data

Aug. 17, 1992 [DE] Germany ............... 4227162

[51] Int. Cl.⁶ .............................................. G01V 3/00
[52] U.S. Cl. ................................... 324/320; 324/319
[58] Field of Search .............. 324/300, 307, 309, 318, 324/319, 320; 128/653.5

[56] References Cited

U.S. PATENT DOCUMENTS

| | | | |
|---|---|---|---|
| 3,569,823 | 10/1968 | Goley | 336/200 |
| 4,748,409 | 5/1988 | Frahm et al. | 324/309 |
| 4,761,614 | 8/1988 | Prammer et al. | 324/320 |
| 4,899,109 | 2/1990 | Tropp et al. | 324/320 |
| 4,987,371 | 1/1991 | Glover et al. | 324/320 |
| 5,006,804 | 4/1991 | Dorri et al. | 324/320 |

OTHER PUBLICATIONS

"Aspects of Shimming a Superconductive Whole-Body MRI-Magnet," Frese et al., Proc. of the 9$^{th}$ Int. Conf. on Magnet Technology, Zurich, Sep. 9-13, 1985, pp. 249-251.

"NMR Imaging Techniques and Applications: A Review," Bottomley, Rev. Sci. Instrum. 53(9), Sep. 1982, pp. 1319-1337.

"Fast, Noniterative Shimming of Spatially Localized Signals. In Vivo Analysis of the Magnetic Field along Axes," Gruetter, J. Mag. Res. vol. 96 (1992), pp. 233-334.

Primary Examiner—Louis Arana
Attorney, Agent, or Firm—Hill, Steadman & Simpson

[57] ABSTRACT

To improve the homogeneity of the basic magnetic field generated in a nuclear magnetic resonance tomography unit, an iterative shimming method includes the steps of generating a pulse sequence in the form of a bipolar gradient pulse train in the examination volume, and entering the echo signals which are acquired into a measured matrix. A correlation coefficient of the echo signals of at least a part of the rows of the measurement matrix is formed with respect to a reference row. The shim current through at least one shim coil in the tomography apparatus is then varied in a manner causing the correlation coefficient to increase. These steps are repeated until the correlation coefficient reaches a selected value which is large enough to indicate that an adequate basic field homogeneity has been achieved.

15 Claims, 6 Drawing Sheets